United States Patent
Engel et al.

(10) Patent No.: US 9,234,736 B2
(45) Date of Patent: Jan. 12, 2016

(54) SENSOR ASSEMBLY FOR DETERMINING A SPATIAL POSITION OF A FIRST PART RELATIVE TO A SECOND PART

(71) Applicants: Carl Zeiss Industrielle Messtechnik GmbH, Oberkochen (DE); Sensitec GmbH, Lahnau (DE)

(72) Inventors: Thomas Engel, Aalen (DE); Uwe Loreit, Wetzlar (DE)

(73) Assignees: CARL ZEISS INDUSTRIELLE MESSTECHNIK GMBH, Oberkochen (DE); SENSITEC GMBH, Lahnau (DE)

( * ) Notice: Subject to any disclaimer, the term of this patent is extended or adjusted under 35 U.S.C. 154(b) by 267 days.

(21) Appl. No.: 13/761,467

(22) Filed: Feb. 7, 2013

(65) Prior Publication Data

US 2013/0147467 A1   Jun. 13, 2013

Related U.S. Application Data

(63) Continuation of application No. PCT/EP2011/063415, filed on Aug. 4, 2011.

(30) Foreign Application Priority Data

Aug. 10, 2010   (DE) .................. 10 2010 034 482

(51) Int. Cl.
*G01B 7/30* (2006.01)
*G01B 7/14* (2006.01)
(Continued)

(52) U.S. Cl.
CPC *G01B 7/14* (2013.01); *G01B 7/012* (2013.01); *G01D 5/145* (2013.01); *G01R 33/0082* (2013.01)

(58) Field of Classification Search
CPC .......... G01B 7/012; G01B 7/14; G01D 5/145; G01R 33/0082
USPC ............................................ 324/207.25, 244
See application file for complete search history.

(56) References Cited

U.S. PATENT DOCUMENTS 4,661,773 A * 4/1987 Kawakita et al. ........ 324/207.22
4,866,854 A    9/1989 Seltzer
(Continued)

FOREIGN PATENT DOCUMENTS

CN   201322592     10/2009
DE   37 08 105 A1   9/1988
(Continued)

OTHER PUBLICATIONS

ISA/EP; English language translation of International Preliminary Report on Patentability (Chapter 1); issued by WIPO Feb. 12, 2013; 11 pp.

(Continued)

*Primary Examiner* — Jay Patidar
(74) *Attorney, Agent, or Firm* — Harness, Dickey & Pierce, P.L.C.

(57) ABSTRACT

A sensor assembly for determining a spatial position of a first part relative to a second part has at least one magnet disposed on the first part. The magnet generates a magnetic field that extends to the second part. The sensor assembly further has a pair of magnetic field sensors arranged at a spatial distance from each other on the second part. The magnet is positioned in an interval defined by the spatial distance between the magnetic field sensors. The magnetic field sensors each produce an output signal depending on the magnetic field. The output signals of the two magnetic field sensors are combined to form a common sensor signal related to the spatial position of the first part relative to the second part. The output signals of the two magnetic field sensors essentially represent a direction of the magnetic field at the location of the respective magnetic field sensors.

16 Claims, 5 Drawing Sheets

(51) Int. Cl.
*G01B 7/012* (2006.01)
*G01D 5/14* (2006.01)
*G01R 33/00* (2006.01)

(56) References Cited

U.S. PATENT DOCUMENTS

| | | | |
|---|---|---|---|
| 6,011,390 A | 1/2000 | Loreit et al. | |
| 7,132,824 B2* | 11/2006 | Masuda et al. | 324/207.12 |
| 7,284,337 B2 | 10/2007 | Brenner et al. | |
| 7,443,161 B2 | 10/2008 | Butzmann | |
| 7,472,491 B2 | 1/2009 | Fischer | |
| 8,269,486 B2* | 9/2012 | Hammerschmidt et al. | 324/207.21 |
| 8,400,096 B2* | 3/2013 | Miyashita et al. | 318/602 |
| 8,587,294 B2 | 11/2013 | Masson et al. | |
| 2002/0171418 A1 | 11/2002 | Hinz et al. | |
| 2003/0000307 A1 | 1/2003 | Lohberg | |
| 2010/0060577 A1 | 3/2010 | Wang | |

FOREIGN PATENT DOCUMENTS

| | | |
|---|---|---|
| DE | 37 15 698 A1 | 12/1988 |
| DE | 195 21 617 C1 | 3/1997 |
| DE | 197 41 579 A1 | 3/1999 |
| DE | 197 46 199 A1 | 4/1999 |
| DE | 198 39 450 A1 | 3/2000 |
| DE | 102 33 080 A1 | 2/2004 |
| DE | 103 48 887 A1 | 5/2004 |
| DE | 103 14 838 A1 | 10/2004 |
| DE | 10 2004 011 728 A1 | 9/2005 |
| DE | 10 2005 055 905 A1 | 5/2007 |
| DE | 10 2009 039 977 A1 | 4/2010 |
| GB | 2 205 650 A | 12/1988 |
| JP | 10-020999 | 1/1998 |
| JP | 2003-149001 | 5/2003 |
| JP | 2006-504085 | 2/2006 |
| JP | 2006-185976 | 7/2006 |
| JP | 2007-139769 | 6/2007 |
| JP | 2007-518092 | 7/2007 |
| JP | 2008-101953 | 5/2008 |
| JP | 2008-233090 | 10/2008 |
| JP | 2009-150732 | 7/2009 |
| JP | 2009-526985 | 7/2009 |
| WO | 01/51893 A1 | 7/2001 |
| WO | WO 2004/038324 A1 | 5/2004 |
| WO | WO 2007/093789 A1 | 8/2007 |
| WO | WO 2009/101270 A2 | 8/2009 |

OTHER PUBLICATIONS

Uwe Loreit; Magnetoresistiver Winkelsensorchip mit hoher Genauigkeit bei geringer Feldstärke; 11 pp., 1999.
Uwe Loreit et al.; Magnetoresistive Sensoren in der Meβ- und Speichertechnik; 4 pp.
F. Dettmann et al.; Magnetoresistive Sensorelemente; 3 pp., 1989.
F. Dettmann et al.; Messung mechanischer Gröβen mit magnetoresistiven Sensoren; 3 pp., 1989.
Uwe Loreit; Magnetoresistive Winkelsensoren für extreme Einsatzbedingungen; 11 pp.
English language translation of Examination Report from corresponding Japanese case mailed Mar. 17, 2015; 6 pp.

* cited by examiner

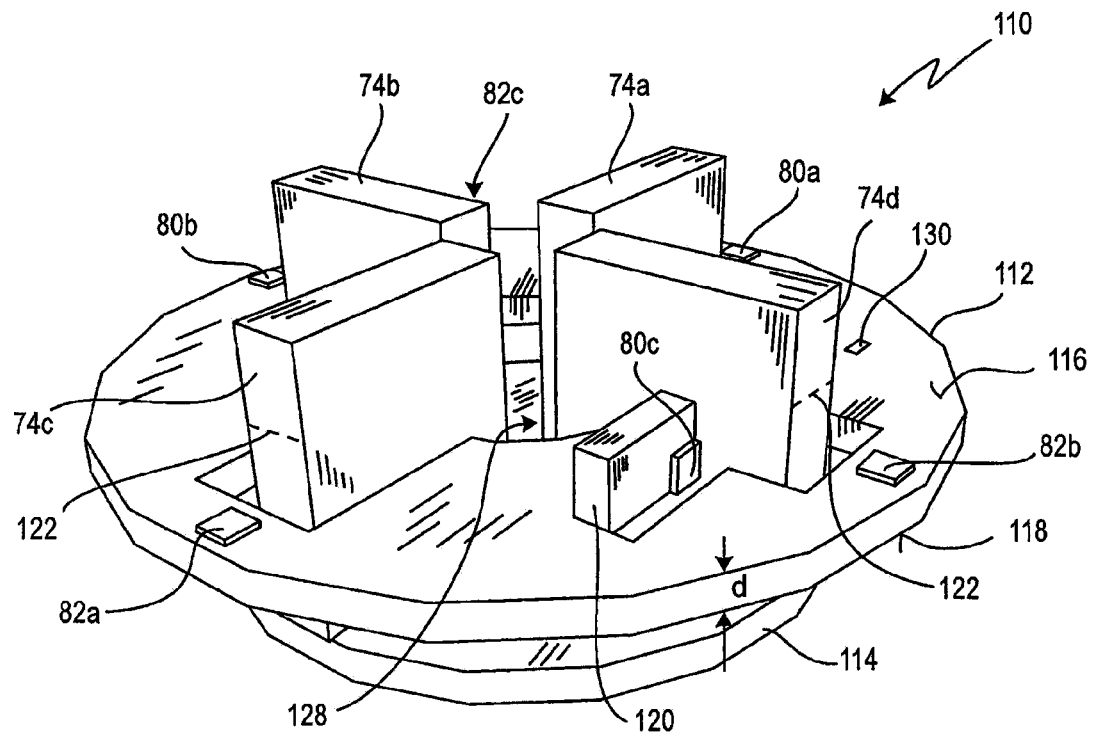
Fig. 7
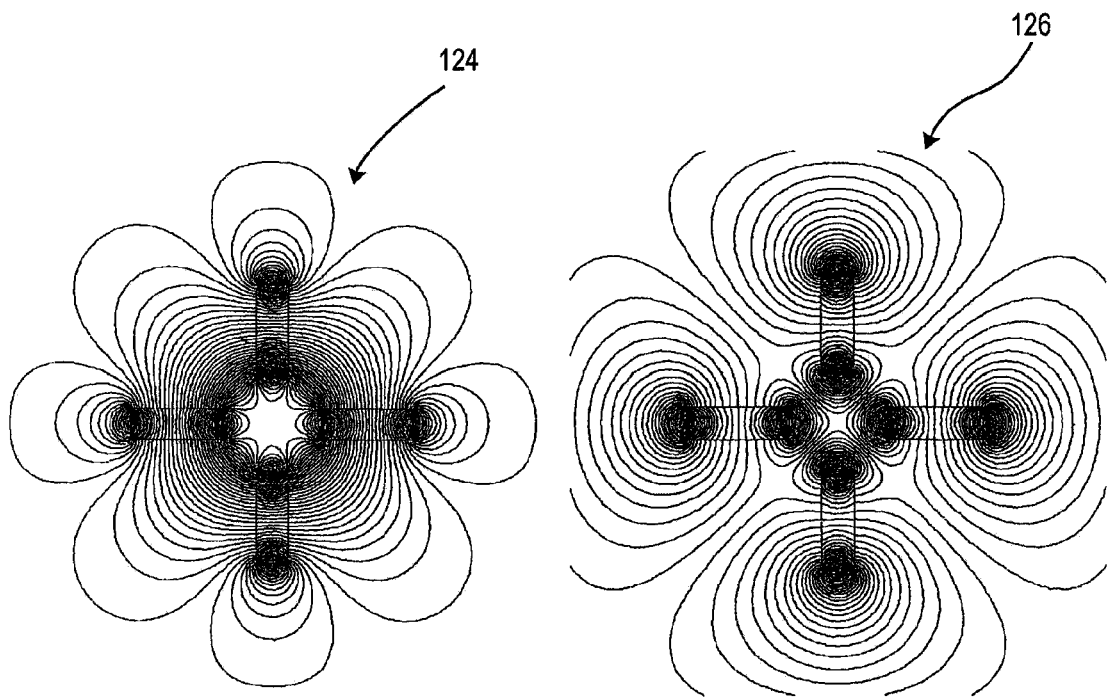
Fig. 8
Fig. 9

SENSOR ASSEMBLY FOR DETERMINING A SPATIAL POSITION OF A FIRST PART RELATIVE TO A SECOND PART

CROSS REFERENCES TO RELATED APPLICATIONS

This application is a continuation of international patent application PCT/EP2011/063415 filed on Aug. 4, 2011 designating the U.S., which international patent application has been published in German language and claims priority from German patent application DE 10 2010 034 482.6 filed on Aug. 10, 2010. The entire contents of these priority applications are incorporated herein by reference.

BACKGROUND OF THE INVENTION

The present invention relates to a sensor assembly and a method for determining a spatial position of a first part relative to a second part. The method and assembly can advantageously be used in a contact probe head for a coordinate measuring machine in order to determine the relative position of the sensing element of the probe head relative to a probe head base.

U.S. Pat. No. 4,866,854 discloses a sensor assembly using two Hall elements in order to determine a relative position. The two Hall elements are arranged on opposite sides of a magnet, so that the North pole and the South pole of the magnet each point towards a Hall element. Each Hall element produces an output signal representing the distance between the Hall element and the side of the magnet that is opposite thereto. If the magnet moves closer to one of the Hall elements, the distance to the other Hall element increases. In this way a position change of the first part relative to the second part along a measurement axis, which corresponds to the connecting line between the two Hall elements, is detected twice. A common sensor signal, which is representative of the actual position of the magnet between the two Hall elements, is produced by generating the difference between the two output signals. In some exemplary embodiments, U.S. Pat. No. 4,866,854 also proposes a plurality of magnets and a plurality of Hall element pairs so that the actual spatial position of the first part relative to the second part can be determined along a plurality of measurement axes. For this a magnet is required for each Hall element pair.

Hall elements respond essentially to a change of the magnitude of the magnetic field strength. By forming the difference of the output signals of each two opposing Hall elements, a common sensor signal is produced that is approximately proportional to the position of the magnet between the two Hall elements. The known sensor assembly allegedly has good sensitivity, selectivity and resolution. It is disadvantageous that the known sensor assembly requires a plurality of magnets for position determination in a plurality of measurement axes, which magnets should be disposed as far apart from each other as possible in order to achieve good decoupling between the sensor pairs. Each sensor pair requires "its" magnet. The required distances make it difficult to implement the known sensor assembly for a plurality of measurement axes in a compact manner. Furthermore, the assembly and the installation of the known sensor assembly in a device, such as the probe head of a coordinate measurement machine, require many individual assembly steps.

Sensor assemblies of the above-mentioned type are particularly necessary in coordinate measurement machines. Coordinate measurement machines usually comprise a so-called probe head, which is attached to a frame. With the aid of the frame the probe head can be moved relative to a measurement object. The probe head comprises a movable sensing element, typically in the form of a stylus. The probe head is moved towards the measurement object until the free end of the stylus contacts a target measurement point. The stylus is deflected relative to the probe head as a result of the contacting. Spatial coordinates, which are representative of the sensed measurement point, are then determined from the position of the probe head relative to the measurement object and from the position of the stylus relative to the probe head. Geometric dimensions and/or the shape of the measurement object can be determined by sensing a plurality of measurement points and determining the corresponding spatial coordinates.

DE 103 48 887 A1 discloses a probe head for a coordinate measurement machine. Again, pairs of Hall elements are used to determine the position of the stylus relative to the base of the probe head. As with the arrangement from U.S. Pat. No. 4,866,854, a Hall element pair is required for each measurement axis. Again, the individual Hall element pairs and the associated magnet are disposed at different points of the probe head as far apart as possible.

DE 10 2004 011 728 A1 discloses another probe head for a coordinate measurement machine having Hall elements and magnets. A Hall element is provided for each measurement axis and is disposed between two opposed magnets. Two measurement axes of the sensor assembly are combined on a supporting plate. The third spatial direction must be detected with a Hall element and an associated magnet pair, which must be separately mounted in the probe head.

As an alternative to Hall elements it has been envisaged to use so-called magnetoresistive sensors. DE 37 08 105 A1 discloses such a probe head for a coordinate measurement machine, wherein a single magnet is disposed on the end of the stylus closer to the probe head base. A plurality of magnetoresistive sensors is distributed on a detector surface that is disposed opposite the magnet. The known sensor assembly is quite compact. The measurement accuracy is limited, however, in particular because the Earth's magnetic field can cause unknown disturbances.

The structure and the principle of operation of the magnetoresistive sensors are known from various documents, for example from DE 195 21 617 C1 or from numerous publications in journals or at conferences. The sensors are frequently based on the so-called anisotropic magnetoresistive effect (AMR effect) or on the giant magnetoresistive effect (GMR effect). The AMR effect alters the electrical resistance of a ferromagnetic material through which a current is flowing depending on the angle between the current density vector and the magnetic field vector. The GMR effect is a quantum mechanical effect, which likewise causes a change of the electrical resistance of a ferromagnetic structure. AMR and GMR sensors have replaced the previously used so-called field plates. Field plates are magnetically variable resistances, in which the change in resistance is based on a change in the path length of the electrons in the magnetic field as a result of the Lorentz force.

DE 37 15 698 A1 discloses a probe head having three field plates, which are disposed on an outer circular ring, which is concentric to an inner circular ring having magnetic antipoles. Said sensor assembly appears quite compact. However, the measurement accuracy might be very limited owing to the sensors used and owing to the influences of the Earth's magnetic field.

SUMMARY OF THE INVENTION

Against this background, it is an object of the present invention to provide a sensor assembly which allows for a very accurate determination of position even in the presence of external disturbances, such as variations of the Earth's magnetic field.

It is another object to provide a sensor assembly for determining a relative position in various axes, which assembly can be implemented in a very compact manner.

It is another object to provide a compact and inexpensive 2D or 3D sensor assembly for determining a relative position of a first part relative to a second part.

According to a first aspect of the invention, there is provided a sensor assembly for determining a spatial position of a first part relative to a second part, comprising at least one magnet disposed on the first part and designed for generating a magnetic field that extends to the second part, said magnetic field having a plurality of directions depending on a position relative to the at least one magnet, comprising a first, a second, a third and a fourth magnetic field sensor each arranged on the second part and each designed to produce an output signal essentially varying as a function of the direction of the magnetic field at the location of the respective magnetic field sensor, and comprising a signal generator designed for determining a first and a second sensor signal by combining the output signals from the first, second, third and fourth magnetic field sensors, wherein the first and the second magnetic field sensors are arranged at a first spatial distance from one another and form a first pair of magnetic field sensors, said first spatial distance defining a first interval and a first measurement axis transverse to said first interval, wherein the third and the fourth magnetic field sensors are arranged at a second spatial distance from one another and form a second pair of magnetic field sensors, said second spatial distance defining a second interval and a second measurement axis transverse to said second interval, wherein the at least one magnet is positioned in said first and second intervals, wherein the first and second measurement axes are substantially orthogonal with respect to each other, and wherein the first sensor signal varies as a function of a spatial position of the first part relative to the second part along the first measurement axis and the second sensor signal varies as a function of the spatial position of the first part relative to the second part along the second measurement axis.

According to another aspect, there is provided a sensor assembly for determining a spatial position of a first part relative to a second part, comprising at least one magnet disposed on the first part and generating a magnetic field that extends to the second part, comprising a first magnetic field sensor arranged on the second part for producing a first output signal essentially depending on the direction of the magnetic field at the location of the first magnetic field sensor, comprising a second magnetic field sensor arranged on the second part for producing a second output signal essentially depending on the direction of the magnetic field at the location of the second magnetic field sensor, and comprising a signal combiner for combining the first and second output signals to form a common sensor signal representing a spatial position of the first part relative to the second part, wherein the first magnetic field sensor and the second magnetic field sensor are arranged at a spatial distance from one another on the second part, and the at least one magnet is positioned in an interval defined by said spatial distance.

According to yet another aspect, there is provided a method for determining a spatial position of a first part relative to a second part, the method comprising the steps of arranging at least one magnet on the first part so that the magnet generates a magnetic field that extends to the second part, arranging a first and a second magnetic field sensor at a spatial distance from each other on the second part, wherein the at least one magnet is positioned in an interval defined by said spatial distance between the first and second magnetic field sensors, receiving a first output signal from the first magnetic field sensor and receiving a second output signal from the second magnetic field sensor, wherein the first and second output signals depend on a sensor position of the respective magnetic field sensor in the magnetic field, and determining a common sensor signal which depends on the spatial position of the first part relative to the second part along a defined measurement axis by combining the output signals of the first and second magnetic field sensors to form a common sensor signal, wherein the defined measurement axis is selected to be transverse to the spatial distance, and the output signals of the first and second magnetic field sensors essentially represent a magnetic field direction at the location of the respective magnetic field sensor.

Preferably, the sensor assembly and the method are used in a probe head for a coordinate measurement machine in order to determine the deflection of the sensing element (stylus) relative to the base of the probe head. Accordingly, there is provided a probe head for a coordinate measurement machine, comprising a probe head base and a sensing element, which is movably mounted on the probe head base, and comprising a sensor assembly for determining an effective position of the sensing element relative to the probe head base, with said sensor assembly comprising at least one magnet arranged on one of the probe head base and the sensing element for generating a magnetic field that extends to the other one of the probe head base and the sensing element, comprising a first magnetic field sensor arranged on the other one of the probe head base and the sensing element for producing a first output signal essentially depending on the direction of the magnetic field at the location of the first magnetic field sensor, comprising a second magnetic field sensor arranged on the other one of the probe head base and the sensing element for producing a second output signal essentially depending on the direction of the magnetic field at the location of the second magnetic field sensor, and comprising a signal combiner for combining the first and second output signals to form a common sensor signal representing a spatial position of the sensing element relative to the probe head base, wherein the first magnetic field sensor and the second magnetic field sensor are arranged at a spatial distance from one another, and the at least one magnet is positioned in an interval defined by said spatial distance.

The novel sensor assembly and method use at least two magnetic field sensors, between which a magnet for the generation of a defined magnetic field is disposed. Advantageously, the measurement axis does not extend along the connecting line between the two magnetic field sensors, but transversely thereto. In preferred embodiments, the measurement axis extends orthogonally to the distance vector between the two magnetic field sensors. Accordingly, the magnet moves transversely and preferably orthogonally to the connecting line between the two magnetic field sensors. The two magnetic field sensors each detect the actual magnetic field direction, i.e. the vectorial direction of the magnetic field lines at the location of the sensors. In the preferred embodiments, the output signals of the magnetic field sensors are substantially independent of the magnitude of the magnetic field strength, i.e. the magnetic field sensors in practice only evaluate the direction of the magnetic field relative to the sensors. The magnitude of the magnetic field strength, i.e. the strength of the magnetic field at the location of the sensors, is of no consequence as long as the magnetic field strength is high enough to produce an output signal with the sensors.

In preferred exemplary embodiments, the magnetic field sensors are magnetoresistive sensors, which are based on the AMR effect. In other exemplary embodiments, the magnetic field sensors can be GMR sensors. Moreover, in principle the magnetic field sensors can also be other sensors, in which the output signals primarily depend on the magnetic field direction and not or only to a lesser extent on the magnetic field strength.

The novel sensor assembly and method use sensors, which at least detect a magnetic field direction, in a common magnetic field, wherein the two sensors of the dual assembly lie on opposite sides of the magnet. The result of this is that directional changes of the common magnetic field because of a relative movement of the two parts behave oppositely. External disturbances, for example as a result of the Earth's magnetic field, can thus easily be eliminated. Furthermore, the output signals of the sensors are quite insensitive to changes in temperature, because the magnetic field direction depends much less on the ambient temperature than for example the magnetic field strength of a magnet. In addition, the course of the magnetic field lines can be rather accurately determined and optimized by means of the geometric dimensions and the geometric disposition of the at least one magnet. It is advantageous if the magnetic field lines in the area near the sensors have a relatively strong curvature, since the sensors then respond very sensitively to a displacement of the magnetic field. As a result of this, the novel sensor assembly can be optimized quite simply for high measurement accuracy and the high measurement accuracy can be guaranteed very well in mass production by reproduction of the geometric dimensions. The novel sensor assembly can thus be implemented very inexpensively.

As explained further below with reference to preferred exemplary embodiments, the novel sensor assembly can be advantageously implemented as a 3D sensor assembly, wherein a single integrated sensor assembly is capable of determining all degrees of freedom of two parts moving relative to each other.

In a preferred refinement, the sensor assembly comprises an adder, which adds the output signals of the first and second magnetic field sensors in order to provide a common sensor signal. Preferably, the adder is further capable of forming a mean value of the two output signals of the first and second magnetic field sensors.

Accordingly, the common sensor signal represents the mean value of the two output signals in the preferred embodiments, taking into account the opposite magnetic field directions. In some preferred exemplary embodiments the sensors each provide at least one output signal that varies sinusoidally or cosinusoidally if the position of the first part relative to the second part varies. Because the magnetic field lines of the common magnetic field are opposite at the two remote sensors, the adder forms a sensor signal that is zero for undistorted, ideal symmetrical magnetic fields at the two sensors. Deviations from zero are either the result of a deflection of the first part relative to the second part, or of a disturbance of the symmetry of the magnetic field between the two sensors. If the rest position of the first part is determined prior to a measurement, possibly by means of a calibration, disturbances can be detected very easily by using the summation signal and eliminated during the determination of the position.

In some exemplary embodiments, the adder is implemented by means of a direct parallel connection of the output signals in hardware form. In other exemplary embodiments, the sensor assembly comprises a programmable circuit, such as a microcontroller, microprocessor, ASIC or FPGA, which carries out the addition of the output signals and the preferred mean value formation.

In a further refinement, the sensor assembly comprises a subtractor, which forms a difference between the output signals of the first and second magnetic field sensors in order to provide the common sensor signal. It is particularly preferable if the sensor assembly comprises both an adder and also a subtractor in order to provide a summation signal and a difference signal from the two output signals of the magnetic field sensors.

A rotation of the magnetic field relative to the two magnetic field sensors, and consequently a rotation of the first part relative to the second part, can be determined from the difference between the two output signals. This embodiment thus enables the provision of a common sensor signal, which is representative of a further degree of freedom. In preferred exemplary embodiments, the two output signals of the adder and of the subtractor are delivered in parallel, which enables a very rapid determination of two common sensor signals, which are representative of two different degrees of freedom of the relative movement.

In a preferred exemplary refinement, the sensor assembly comprises three pairs of sensors, each with two magnetic field sensors, wherein each pair of sensors provides a summation signal and a difference signal in relation to a different measurement axis. With such a sensor assembly, all six degrees of freedom and hence the so-called posture of the first part relative to the second part can be determined simply and rapidly.

In a further refinement, the magnetic field sensors each have an electrical resistance, which varies depending on the magnetic field direction.

In said refinement the magnetic field sensors are magnetoresistive sensors, in particular AMR sensors. Furthermore, it is preferred if the sensors span a common measurement plane in which the magnetic field lines relevant to the evaluation lie.

Said refinements enable a very flat and accordingly compact implementation of the novel sensor assembly.

In a further refinement, the first and the second magnetic field sensors each generate two different analog output signals, each with an instantaneous value that depends in a sinusoidal or cosinusoidal manner on the magnetic field direction at the location of the respective magnetic field sensor.

Suitable magnetic field sensors of said embodiment are in particular magnetoresistive sensors, each of which internally comprises two resistance measurement bridges that are rotated relative to each other by 45°. A first of said resistance measurement bridges provides a first analog signal, which depends sinusoidally on the direction of the magnetic field at the location of the sensor. A second of said resistance measurement bridges provides a second analog signal, which because of the 45° rotation depends cosinusoidally on the direction of the magnetic field at the location of the sensor. Together, the two analog signals enable very accurate determination of the magnetic field direction at the location of the sensors. The use of such magnetic field sensors enables very rapid signal processing by electrically connecting the sinusoidal (or cosinusoidal) analog signals of the first sensor rotated through 180° with the sinusoidal (or cosinusoidal) analog signals of the second sensor and thus combining the analog signals in a parallel circuit. Two common output signals, which are representative of the magnetic field direction, are obtained very simply and rapidly by the electrical connection of the sine or cosine signals of the two sensors.

Disturbances of the magnetic field by the signal processing are thereby very effectively compensated.

In a further refinement, the sensor assembly comprises at least four magnetic field sensors, which form a first pair and a second pair, each with a first and a second magnetic field sensor, wherein each pair produces a common sensor signal in relation to one of at least two mutually orthogonal measurement axes. Preferably, the sensor assembly comprises at least six magnetic field sensors, which form at least three pairs, wherein each pair provides a common sensor signal for one of three orthogonal measurement axes.

With this refinement a compact 2D or even 3D sensor assembly is provided which provides position information for a plurality of spatial directions. It is thus particularly suitable for determining the deflections of a stylus relative to a base of the probe head.

In a further refinement, the second part comprises a component support on which the magnetic field sensors of the pairs are arranged together. In preferred exemplary embodiments the component support is essentially disk-shaped. In particular, the component support is a circuit board to which the magnetic field sensors are permanently attached, e.g. soldered. Advantageously, other circuit elements are disposed on the circuit board, in particular the adder and/or subtractor, or a temperature sensor, which provides a temperature signal representative of the operating temperature of the circuit board. Furthermore, it is preferable if the component support consists of a thermally stable material, e.g. of a ceramic material, and/or has a known coefficient of thermal expansion.

In said refinement, the sensor assembly is an integrated sensor assembly having pairs of sensors for a plurality of measurement axes. The embodiment enables a very compact implementation and inexpensive fitting in a probe head. The integration of a plurality of pairs of sensors on a component support guarantees, moreover, uniformly high measurement accuracy over a plurality of sensor assemblies of identical construction. The integration of a temperature sensor on the component support enables, moreover, advantageous temperature compensation and as a result yet higher measurement accuracy.

In a further refinement, the component support has a central recess in which the at least one magnet is disposed.

In said refinement, the sensor assembly uses a common magnetic field for the magnetic field sensors of the integrated pairs. This means that the single magnetic field provides position information for at least two orthogonal measurement axes. In preferred exemplary embodiments the sensor assembly uses a single common magnetic field for all measurement axes and thus for all pairs of sensors.

The refinement contributes to a particularly compact structure. Moreover, the refinement enables uniformly high measurement accuracy for all measurement axes because a common reference is evaluated for all measurement axes.

In a further refinement, the sensor assembly comprises a plurality of magnets, which are disposed in the recess and generate a common magnetic field. Preferably, the common magnetic field is rotationally symmetrical in relation to at least two measurement axes, i.e. the common magnetic field appears the same for at least two orthogonal measurement axes. In a particularly preferred exemplary embodiment the sensor assembly comprises four magnets, which are disposed in the shape of a cross.

Said embodiment enables a very compact design with a common magnetic field, which provides high measurement accuracy for all measurement axes. The rotational symmetry of the magnetic field is particularly advantageous for use in the probe head of a coordinate measurement machine, because it provides substantially identical measurement accuracies in two orthogonal measurement axes. Said two axes are advantageously arranged transversely to the Earth's gravitational force, i.e. they form a measurement plane which is usually referred to as an x-y measurement plane in coordinate measurement machines of portal or bridge type structure.

In a further refinement, the component support has an upper side and a lower side, on each of which first and second magnetic field sensors are disposed. Preferably, the upper side and the lower side are substantially parallel to each other. In preferred exemplary embodiments the component support is a circuit board fitted with components on both sides.

Said refinement enables a compact sensor assembly with magnetic field sensors that are separated from each other in three orthogonal spatial directions. In one exemplary embodiment the upper side and the lower side of the component support are fitted with magnetic field sensors in mirror image formations relative to each other, so that at least two pairs of sensors are formed, of which one is disposed on the upper side and one is disposed on the lower side of the component support. Consequently, the pairs of sensors lie in two different measurement planes, which is advantageously used in preferred exemplary embodiments to detect tilting of the component support about an axis parallel to the measurement plane. In other exemplary embodiments a magnetic field sensor on the upper side and a magnetic field sensor on the lower side can form a pair of sensors. The embodiment enables further, selected magnetic field sensors to be used for more than one pair of sensors. In particular, the output signal of a magnetic field sensor can be combined once with the output signal of another magnetic field sensor on the same side and a second time with the output signal of a magnetic field sensor on the opposite side, so that sensor signals are available for a plurality of measurement directions with a small number of magnetic field sensors. In some advantageous exemplary embodiments the sensor assembly comprises a programmable circuit that is designed to relate the digital or digitized output signals of the sensors together in various defined combinations. In one preferred case the programmable circuit thus implements a monitoring and diagnostic function, which enables it to monitor a measurement uncertainty of selected pairs of sensors and/or their proper operation with the aid of a cross-comparison. It is also very advantageous if the output signals of the magnetic field sensors are combined as a plurality of different pairs of sensors, because very efficient plausibility comparisons can be carried out in this way.

In a further refinement, the sensor assembly comprises a temperature correction stage designed to determine a thermally induced position change of the first part relative to the second part using the output signals.

In said refinement, temperature compensation advantageously takes place using only the output signals of the magnetic field sensors. In one exemplary embodiment the output signals of the magnetic field sensors at a reference temperature are stored in a memory of the sensor assembly and/or a memory of a coordinate measurement machine. Prior to a measurement, the output signals of the magnetic field sensors are first determined without a deflection/position change between the first and the second parts. A deviation of the output signals relative to the output signals at the reference temperature enables the preferred temperature compensation without a special temperature sensor or in addition thereto.

It should be understood that the above-mentioned features and the features yet to be explained below can not only be used in the respectively stated combination, but also in other combinations or on their own, without departing from the scope of the present invention.

BRIEF DESCRIPTION OF THE DRAWINGS

Exemplary embodiments of the invention are illustrated in the drawings and are explained in detail in the following description. In the drawings, FIG. 7 shows the mechanical structure of the sensor assembly in a preferred exemplary embodiment, FIG. 8 shows a schematic representation of the common magnetic field of the sensor assembly from FIG. 7, and FIG. 9 shows a common magnetic field of the sensor assembly from FIG. 7 according to an alternative exemplary embodiment.

DESCRIPTION OF PREFERRED EMBODIMENTS

Figure 1:
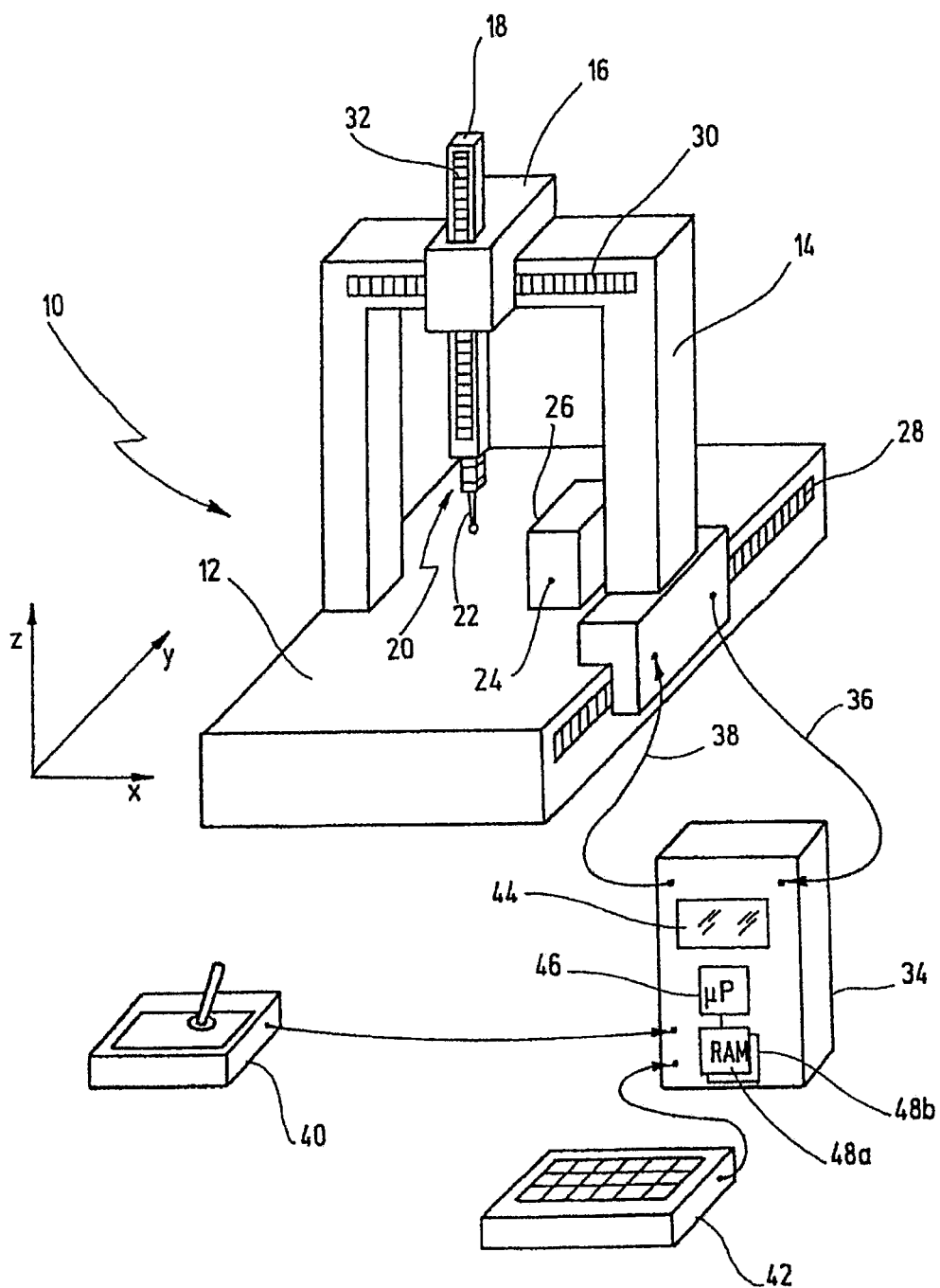
FIG. 1 shows a coordinate measurement machine having a probe head, in which an exemplary embodiment of the new sensor assembly is used.

In FIG. 1 a coordinate measurement machine, in which the novel sensor assembly is advantageously used, is referred to in its entirety with reference number 10. Although the use of the novel sensor assembly in coordinate measurement technology is preferred from today's viewpoint, the invention is not restricted thereto. Rather, the sensor assembly can also be advantageously used in other cases in which the position of a first part relative to a second part is to be determined with high accuracy.

The coordinate measurement machine 10 comprises a base 12, on which a portal 14 is arranged. The portal 14 can be moved relative to the base 12 in a first spatial direction. Typically, said spatial direction is designated as the y axis. On the upper crossbeam of the portal 14 a carriage 16 is disposed, which can be moved relative to the portal 14 in a second spatial direction. The axis of motion of the carriage 16 is usually referred to as the x axis. On the carriage 16 a quill 18 is arranged, which can be moved relative to the carriage in a third spatial direction. Said third spatial direction is usually referred to as the z axis. A probe head 20 having a stylus 22 is disposed at the lower free end of quill 18. The stylus is used to touch a measurement point 24 on a measurement object 26, while the measurement object 26 is disposed on the base 12. A spatial position of the detected measurement point 24 can then be determined from the position of the probe head 20 relative to the coordinate axes x, y, z. If the spatial coordinates at a plurality of measurement points 24 on the measurement object 26 are determined, geometric dimensions and/or the shape of the measurement object 26 can be determined.

The coordinate measurement machine 10 is illustrated here as a portal construction with a movable portal. There are other designs for coordinate measurement machines, e.g. horizontal arm measurement machines or measurement machines in which the base 12 is moved with the measurement object 26.

It should be understood that the novel sensor assembly can also be used advantageously with such coordinate measurement machines.

Position transducers for the axes of motion of the coordinate measurement machine are referred to using reference numbers 28, 30, 32 and can, for example, comprise an incremental encoder or linear scale. Using the position transducers 28, 30, 32 an evaluation and control unit 34 determines the respective actual spatial position of the probe head 20 within the measurement volume. Furthermore, here the evaluation and control unit 34 controls the movements of the portal 14, of the carriage 16 and of the quill 18. Accordingly, the evaluation and control unit 34 is connected via lines 36, 38 to the position transducers 28, 30, 32 and the drives (not shown here) of the coordinate measurement machine 10.

A control part with which an operator of the coordinate measurement machine 10 can change the position of the probe head 20 is referred to using the reference number 40. In the preferred exemplary embodiments the evaluation and control unit 34 also comprises a keyboard 42 and a display 44 as well as a processor 46 and a memory 48. A memory 48$a$ can, for example, be a working memory for the volatile storage of measurement values, whereas a memory 48$b$ comprises a control and measurement program for the measurement object 26.

Figure 2:
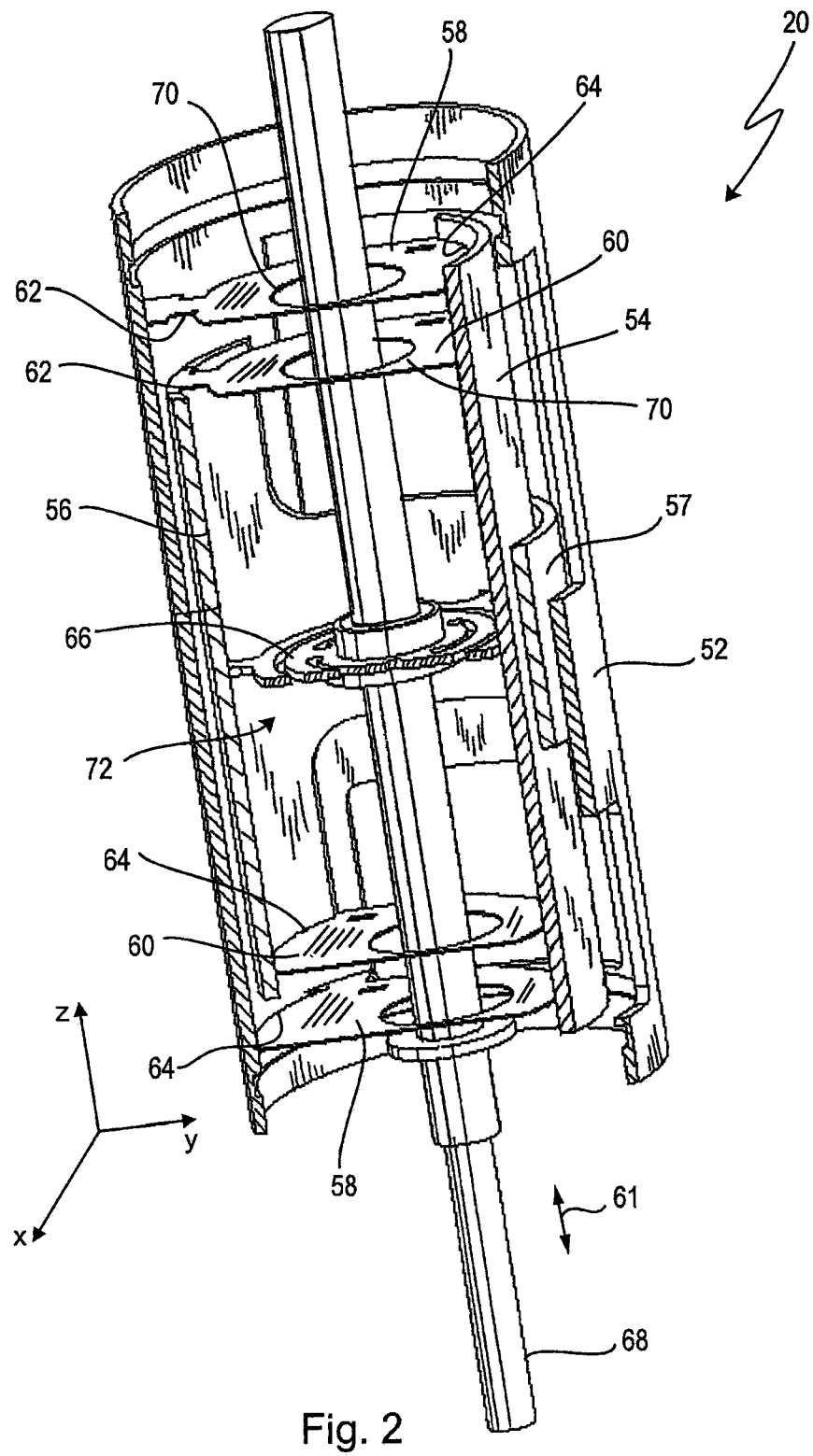
FIG. 2 shows the mechanical structure of the probe head from FIG. 1 in a partially sectional representation.

FIG. 2 shows the mechanical structure of probe head 20 according to a preferred exemplary embodiment. The probe head 20 comprises a cylindrical probe head base 52, which forms a fixed part, relative to which the stylus 22 can move. It should be understood that the probe head base 52 itself can be moved within the measurement volume using the drives of the coordinate measurement machine 10.

The probe head 20 comprises two cylindrical shells 54, 56, which are disposed substantially concentrically within the probe head base 52. The cylindrical shells 54, 56 face towards each other with their respective inner cylindrical shell sides. The cylindrical shell 56 comprises an extension arm 57, which encloses the cylindrical shell 54 from the outside.

The first cylindrical shell 54 is fixed by means of two leaf springs 58 to the inner side of the probe head base 52. Because of the leaf springs 58 the probe head base 52 and the cylindrical shell 54 form a spring parallelogram, which enables a movement of the cylindrical shell 54 relative to the probe head base 52 in a direction that is indicated in FIG. 2 by arrow 61. In some exemplary embodiments, said direction of motion 61 is parallel to the z axis of the coordinate measurement machine 10. However, there are also cases in which the probe head 20 can be pivoted out of the orientation illustrated in FIG. 1, so that the direction of motion 61 is then not parallel to the z axis of the coordinate measurement apparatus 10.

The second cylindrical shell 56 is fixed by means of two further leaf springs 60 to the first cylindrical shell 54 and forms with the cylindrical shell 54 a second spring parallelogram. The two cylindrical shells 54, 56 together with the leaf springs 58, 60 form a double spring parallelogram, which enables a linear movement in the direction of the arrow 61.

In the preferred exemplary embodiment the leaf springs 58, 60 each comprise a three-point connection to the cylindrical shells and the base of the probe head. This means that they are connected by means of a substantially singular connection point 62 to the one cylindrical shell and by means of a rather linear connection 64 or a connection 64 comprising a plurality of connecting points to the other cylindrical shell. Said three-point support reduces internal stresses.

The two cylindrical shells 54, 56 hold a membrane spring 66, which is disposed substantially concentrically within the probe head base 52. A rod 68 is attached to the membrane spring 66 and extends through the recesses 70 in the leaf springs 58, 60. The rod 68 is an extension and/or mounting for the stylus 22. The cylindrical shells 54, 56, the leaf springs 58, 60 and the membrane spring 66 together form a support 72 for the stylus 22 with degrees of freedom in the three orthogonal spatial directions x, y, z. It is the object of the novel sensor assembly here to detect the respective position of the stylus 22 relative to the probe head base 52.

Figure 3:
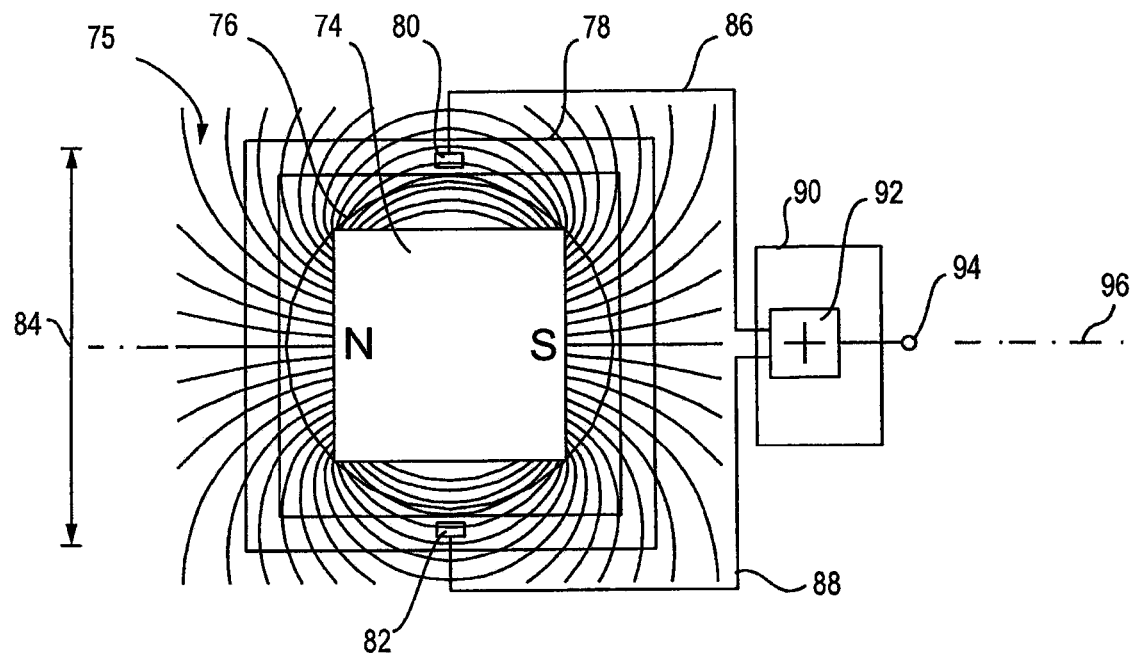
FIG. 3 shows a schematic representation of an exemplary embodiment of the novel sensor assembly.

FIG. 3 shows a simplified, schematic representation of an exemplary embodiment of the novel sensor assembly. In FIG. 3, reference number 74 refers to a magnet that generates a magnetic field 75. The magnet 74 is disposed on a first part 76, which is in the form of a supporting plate—here in particular substantially circular. A second part is referred to by reference number 78. The second part 78 is a frame, which is disposed approximately concentrically about the first part 76. Reference numbers 80, 82 refer to two magnetic field sensors, which in a preferred exemplary embodiment are magnetoresistive AMR sensors. The sensors 80, 82 are disposed at a distance 84 from each other. The magnet 74 is disposed in the interval defined by the distance between the sensors 80, 82. Each sensor 80, 82 provides an output signal 86 or 88 that is dependent on the respective direction of the magnetic field lines at the location of the respective sensor. In one exemplary embodiment the sensors 80, 82 are angle sensors, which provide an—in particular digital—output signal, which is representative of the magnetic field direction of the magnet 74 at the location of the respective sensor. The output signals 86, 88 are fed to a signal generator circuit 90, which in this case comprises an adder 92. The adder 92 forms a summation signal of the two output signals 86, 88 taking into account their respective signs. In one case the summation signal can be the sum of absolute values. In said case the summation signal is advantageously divided by two in order to obtain a common sensor signal 94 representative of the mean value of the two output signals 86, 88. In other cases the summation signal can be formed using correct algebraic signs, so that in fact a difference is formed because of the opposite variation of the sensor signals.

The sensor signal 94 is representative of the position of the magnet 74 and consequently representative of the position of the first part relative to the second part along a measurement axis 96. As indicated in FIG. 3, the measurement axis 96 extends transversely to the distance vector 84 between the two sensors 80, 82, wherein the magnet 74 is displaced along the measurement axis 96. As can be seen from the field lines of the magnetic field 75, in the event of a displacement of the magnet 74 along the measurement axis 96 the sensors 80, 82 detect a different magnetic field direction, which leads to a correspondingly changed sensor signal 94.

Figure 4:
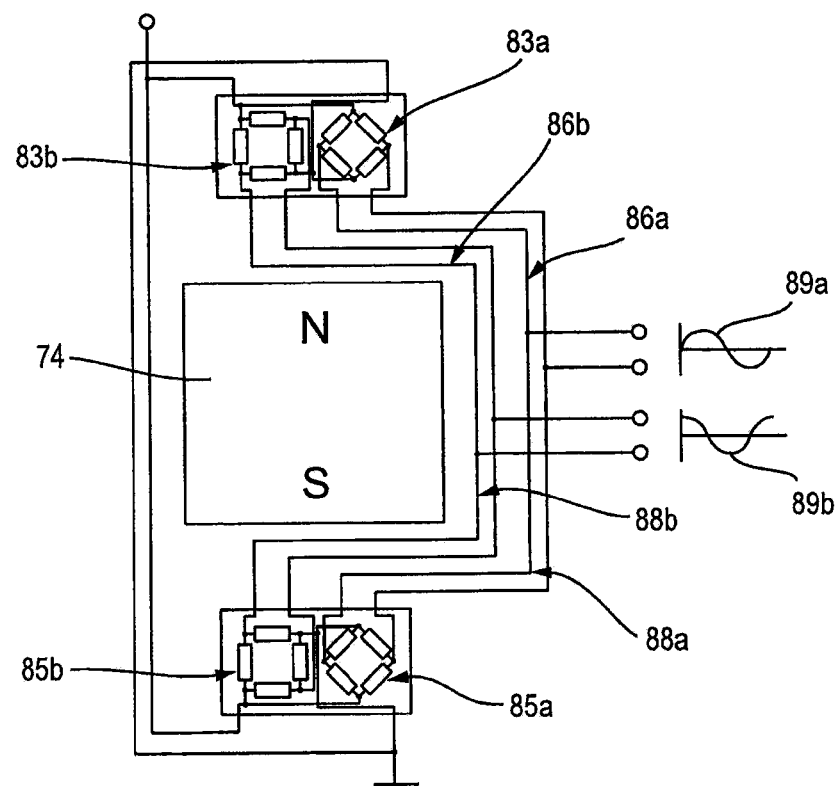
FIG. 4 shows a schematic representation of another exemplary embodiment of the novel sensor assembly.

FIG. 4 shows a preferred exemplary embodiment of the novel sensor assembly. In this case each magnetic field sensor 80, 82 comprises a resistance measurement bridge 83*a*, 83*b* or 85*a*, 85*b*. Each resistance measurement bridge 83*a*, 83*b*, 85*a*, 85*b* forms a separate magnetic field sensor, which generates an output signal 86*a*, 86*b*, 88*a*, 88*b* dependent on the magnetic field direction. The output signals 86*a*, 88*a* are analog output signals, each with an instantaneous value 89*a*, that depends sinusoidally on the magnetic field direction at the location of the resistance measurement bridge 83*a*, 85*a*. The output signals 86*b*, 88*b* are analog output signals, each with an instantaneous value 89*b* dependent cosinusoidally on the magnetic field direction at the location of the resistance measurement bridge 83*b*, 85*b*. The two sinusoidal output signals 86*a*, 88*a* are electrically connected in parallel. The two cosinusoidal output signals 88*a*, 88*b* are likewise electrically connected in parallel.

Figure 5:
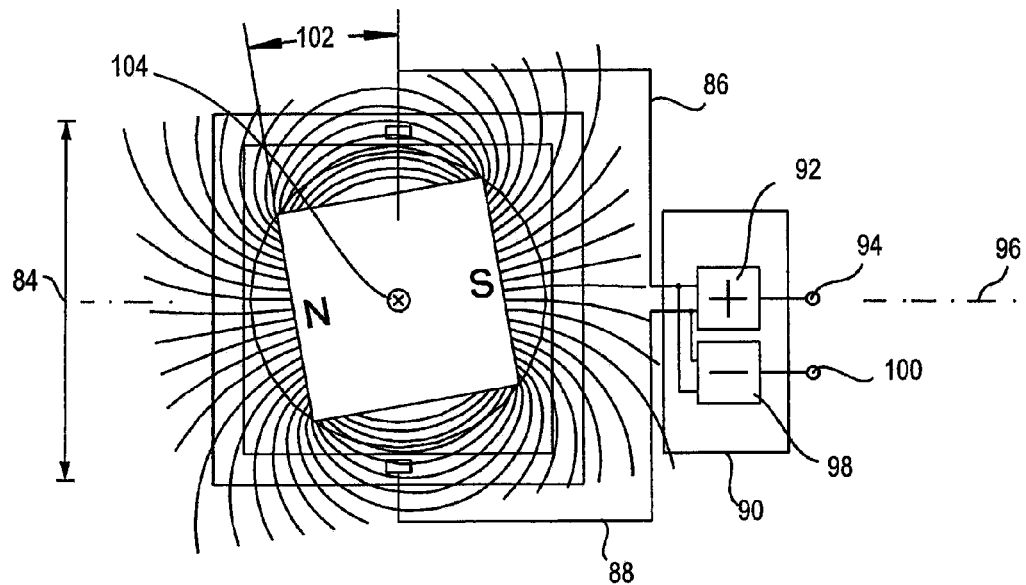
FIG. 5 shows another exemplary embodiment of the sensor assembly.

FIG. 5 shows a further exemplary embodiment, in which the signal generator circuit 90 comprises a subtractor 98 in addition to the adder 92. The subtractor 98 forms the difference of the two output signals 86, 88 and provides a further common sensor signal 100, which because of the difference formation represents a rotation of the first part relative to the second part through a rotation angle 102. As can be seen from FIG. 5, the rotation angle 102 lies in a plane spanned by the distance vector 84 and the measurement axis 96. In other words, sensor signal 100 represents a rotation of the first part relative to the second part about an axis of rotation 104, which is perpendicular to a measurement plane spanned by the sensors 80, 82. The field lines of the magnetic field 75 also lie in exactly said measurement plane. In the preferred exemplary embodiments the sensor signals 94, 100 thus represent a respective actual position of the first part relative to the second part in relation to two degrees of freedom, namely a translational degree of freedom along the measurement axis 96 and a rotational degree of freedom about the axis of rotation 104.

Figure 6:
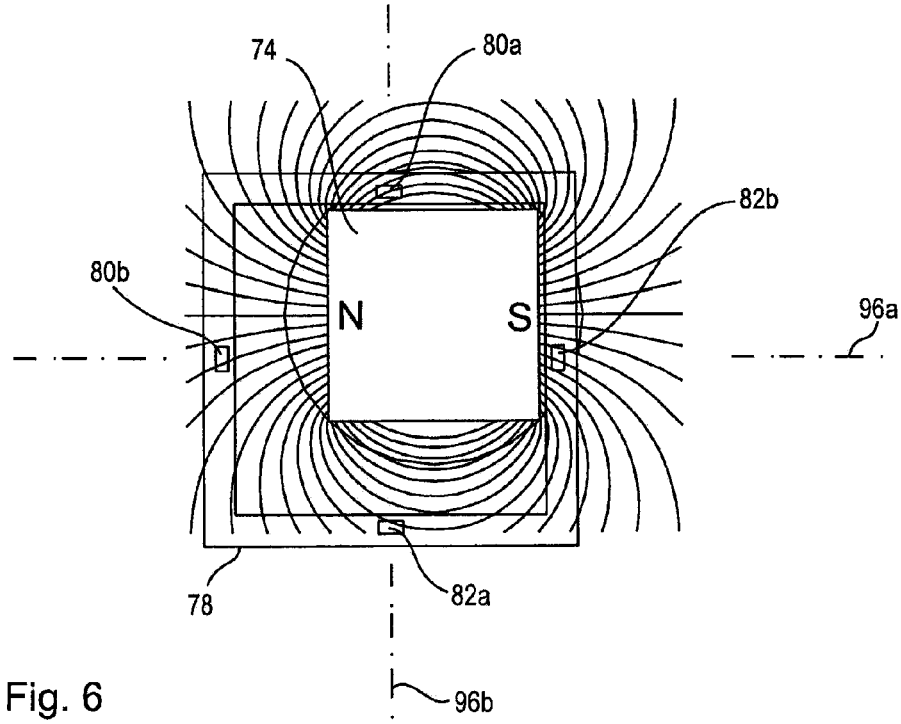
FIG. 6 shows another exemplary embodiment of the sensor assembly having two pairs of sensors for two orthogonal measurement axes.

FIG. 6 shows a development of the sensor assembly from FIG. 5 with two pairs of sensors 80*a*, 82*a* and 80*b*, 82*b*. The pair of sensors 80*a*, 82*a* corresponds to the pair of sensors 80, 82 from FIGS. 3 through 5. The other pair of sensors 80*b*, 82*b* is disposed in the measurement plane of sensors 80*a*, 82*a* and rotated through 90° relative to the pair of sensors 80*a*, 82*a*. The other pair of sensors 80*b*, 82*b* thus provides a common sensor signal along a further measurement axis 96*b*, which in this case is orthogonal to the first measurement axis 96*a*.

FIG. 7 shows a preferred exemplary embodiment of the sensor assembly, which in this case is referred to in its entirety by reference number 110. The sensor assembly 110 comprises an approximately circular disk-shaped component support 112, which is disposed above a further support 114. The component support 112 has an upper side 116 and a lower side 118. Four magnetic field sensors 80*a*, 82*a*, 80*b*, 82*b* are disposed on the upper side 116 and span a common measurement plane on the upper side 116. The magnetic field sensors 80*a*, 82*a* and 80*b*, 82*b* each lie at a distance 84 (cf. FIG. 5) from each other at the outer edge of the component support 112 and form a pair of magnetic field sensors.

Here the sensor assembly 110 further comprises a third pair of sensors, of which in FIG. 7 however, only one magnetic field sensor 80*c* can be seen. A further sensor 82*c* is disposed on the remote rear side of the sensor assembly 110 in FIG. 7. As can be seen from the magnetic field sensor 80*c*, the sensors 80*c*, 82*c* are disposed perpendicular to the measurement plane of the sensors 80*a*, 82*a*, 80*b*, 82*b* on a holder 120, wherein the holder 120 is fixed to the component support 112. The magnetically active surfaces of the sensors 80*c*, 82*c* are substantially perpendicular to the upper side 116. The sensors 80*c*, 82*c* are thus optimally orientated to detect movement of the component support 112 relative to the other support 114 in a direction perpendicular to the upper side 116. In the preferred exemplary embodiments, in which the sensor assembly 110 is used in a probe head of the type shown in FIG. 2, the sensors 80*c*, 82*c* form a common sensor signal, which is representative of a deflection of the stylus 22 in the z direction, whereas the two pairs of sensors 80*a*, 82*a* and 80*b*, 82*b* each provide sensor signals that are representative of the deflection in the x or y direction.

The common magnetic field of the pairs of sensors 80*a*, 82*a*, 80*b*, 82*b*, 80*c*, 82*c* is generated for the sensor assembly 110 using four magnets 74*a*, 74*b*, 74*c*, 74*d*, each of which is rectangular. Each two magnets 74*a*, 74*c* or 74*b*, 74*d* are opposed at their narrow sides. The magnets 74*a*, 74*b*, 74*c*, 74*d* form a cross in plan view on the upper side 116. In preferred exemplary embodiments, the North-South axis 122 of each magnet 74 lies parallel to the measurement plane, which is spanned by the sensors 80a, 82a, 80b, 82b on the upper side 116 of the component support 112. A different common magnetic field results in each case depending on whether equal or unequal magnetic poles are opposed during a rotation along the surface 116.

FIG. 8 shows the common magnetic field 124 of the sensor assembly 110 in a plan view onto the upper side 116, if the North and South poles of the magnets 74 alternate in the circumferential direction, i.e. if a North and a South pole are facing each other along the surface 116 in each case. FIG. 9 shows, in contrast, the common magnetic field 126 of the sensor assembly 110, if equal magnetic poles are facing each other along the upper side 116. In both cases a common magnetic field is the result that is rotationally symmetrical about an imaginary axis of rotation perpendicular to the upper side 116. The common magnetic fields 124, 126 are each thus optimally suitable for determining deflections of a stylus in two orthogonal spatial directions, both of which are advantageously perpendicular to the Earth's gravitational force (and thus typically represent the x and the y axis of the movements of the stylus). Both magnetic field variants have quite strongly curved line courses in the area of the magnetic field sensors 80a, 80b, 82a, 82b, which enables the determination of position with high accuracy.

As can be seen in FIG. 7, the component support 112 comprises a central, substantially cruciform recess 128, in which the cruciformly arranged magnets 74a, 74b, 74c, 74d are disposed. The magnets are fixed onto the other support 114 and can be moved therewith as a whole relative to the component support 112. In exemplary embodiments, the further support 114 can be fixed onto the rod 68 by magnet 74 (cf. FIG. 2), whereas the component support 116 is coupled to the probe head base 52. In the event of a deflection of the stylus 22 relative to the base of the probe head, the position of the common magnetic field 124 or 126 relative to the pairs of sensors changes. The respective actual position of the magnetic field, and hence the actual position of the stylus 22, can be determined in the three spatial directions with the aid of the pairs of sensors.

In one variant of the exemplary embodiment shown in FIG. 7, the component support 112 is fitted with pairs of sensors 80a, 82a and 80b, 82b (not shown here) both on the upper side 116 and also on the lower side 118. In said variant the thickness d of the component support 112 is selected to be of such a magnitude that the pairs of sensors on the upper side 116 and the pairs of sensors on the lower side 118 form two mutually parallel measurement planes, but separated from each other by distance d, wherein the distance d is sufficiently great that a tilting of the component support 112 about the x axis and the y axis can be determined using the sensor signals from the parallel measurement planes. The x axis and the y axis extend parallel to the two measurement planes in this case. A rotation of the component support 112 about the z axis is advantageously determined with the aid of a subtractor 98 according to FIG. 5.

In all preferred exemplary embodiments the component support 112 consists of a thermally stable material, i.e. a material with a low coefficient of thermal expansion. In some exemplary embodiments a temperature sensor 130 is disposed on the component support 112. Using the temperature sensor 130, the evaluation and control unit 34 of the coordinate measurement machine 10 or a signal processing unit in the sensor assembly 110 can carry out temperature compensation by correcting thermally induced position changes of the component support 112 relative to the magnetic field 124, 126 using the known temperature coefficients.

In other exemplary embodiments, the sensor assembly 110 can be implemented without a temperature sensor 126, because the common sensor signals 94 of the pairs of sensors are determined at a reference temperature and provided as reference values in a memory of the evaluation unit. Prior to carrying out an actual measurement, the evaluation unit first determines the common sensor signals of the pairs of sensors while the component support 112 is in its rest position. Correction values for temperature compensation are determined from the difference of the actual determined sensor signals and the sensor signals at the reference temperature. In some exemplary embodiments, said temperature compensation takes place in the evaluation and control unit 34 of the coordinate measurement machine 10. The evaluation unit 34 consequently comprises a temperature correction stage. In other exemplary embodiments the temperature correction stage can be integrated onto the component support 112.

What is claimed is:
1. A sensor assembly for determining a spatial position of a first part relative to a second part, comprising:
at least one magnet disposed on the first part and designed for generating a magnetic field that extends to the second part, said magnetic field having a plurality of directions depending on a position relative to the at least one magnet,
a first, a second, a third and fourth magnetic field sensor each arranged on the second part and each designed to produce an output signal essentially varying as a function of the direction of the magnetic field at the location of the respective magnetic field sensor,
a signal generator designed for determining a first and second sensor signal by combining the output signals from the first, second, third and fourth magnetic field sensors,
wherein the first and the second magnetic field sensors are arranged at a first spatial distance from one another and form a first pair of magnetic field sensors, said first spatial distance defining a first interval and a first measurement axis transverse to said first interval,
wherein the third and the fourth magnetic field sensors are arranged at a second spatial distance from one another and form a second pair of magnetic field sensors, said second spatial distance defining a second interval and a second measurement axis transverse to said second interval,
wherein the at least one magnet is positioned in said first and second intervals,
wherein the first and second measurement axes are substantially orthogonal with respect to each other,
wherein the first sensor signal varies as a function of a spatial position of the first part relative to the second part along the first measurement axis and the second sensor signal varies as a function of the spatial position of the first part relative to the second part along the second measurement axis,
wherein the signal generator comprises an adder which adds the output signals of the magnetic field sensors of at least one pair in order to determine at least one from the first and second sensor signals, and
wherein the signal generator further comprises a subtractor which forms a difference between the output signals of the magnetic field sensors of at least one pair in order to determine a further sensor signal representative of a rotational position of the first part relative to the second part about a further axis transvers to the first and second measurement axes.

2. The sensor assembly of claim 1, wherein the magnetic field sensors each comprise an electrical resistance which varies as a function of the direction of the magnetic field at the location of the respective magnetic field sensor.

3. The sensor assembly of claim 1, wherein the second part comprises a component support, on which the first, second, third and fourth magnetic field sensors are commonly arranged.

4. The sensor assembly of claim 3, wherein the component support comprises a central recess in which the at least one magnet is arranged.

5. The sensor assembly of claim 4, wherein the at least one magnet comprises a plurality of magnets which are arranged in the recess and commonly generate the magnetic field.

6. The sensor assembly claim 4, wherein the component support comprises a first side and a second side facing away from the first side, wherein the magnetic field sensors of the first and second pair are arranged on the first side, and wherein a third pair of magnetic field sensors is arranged on the second side in order to provide a third sensor signal.

7. The sensor assembly of claim 1, further comprising a temperature correction stage designed to determine a thermally induced position change of the first part relative to the second part from the output signals of the first, second, third, and fourth sensors.

8. A sensor assembly for determining a spatial position of a first part relative to a second part, comprising:
   at least one magnet disposed on the first part and designed for generating a magnetic field that extends to the second part, said magnetic field having a plurality of directions depending on a position relative to the at least one magnet,
   a first, a second, a third and a fourth magnetic field sensor each arranged on the second part and each designed to produce an output signal essentially varying as a function of the direction of the magnetic field at the location of the respective magnetic field sensor,
   a signal generator designed for determining a first and a second sensor signal by combining the output signals from the first, second, third and fourth magnetic field sensors,
   wherein the first and the second magnetic field sensors are arranged at a first spatial distance from one another and form a first pair of magnetic field sensors, said first spatial distance defining a first interval and a first measurement axis transverse to said first interval,
   wherein the third and the fourth magnetic field sensors are arranged at a second spatial distance from one another and form a second pair of magnetic field sensors, said second spatial distance defining a second interval and a second measurement axis transverse to said second interval,
   wherein the at least one magnet is positioned in said first and second intervals,
   wherein the first and second measurement axes are substantially orthogonal with respect to each other,
   wherein the first sensor signal varies as a function of a spatial position of the first part relative to the second part along the first measurement axis and the second sensor signal varies as a function of the spatial position of the first part relative to the second part along the second measurement axis, and
   wherein the output signal of at least one of the magnetic field sensors comprises two different analog signals, with a first analog signal from the two different analog signals depending sinusoidally on the direction of the magnetic field at the location of said at least one of the magnetic field sensors, and with a second analog signal from the two different analog signals depending cosinusoidally on the direction of the magnetic field at the location of said at least one of the magnetic field sensors.

9. The sensor assembly of claim 8, wherein the second part comprises a component support, on which the first, second, third and fourth magnetic field sensors are commonly arranged.

10. The sensor assembly of claim 9, wherein the component support comprises a central recess in which the at least one magnet is arranged.

11. The sensor assembly of claim 9, wherein the at least one magnet comprises a plurality of magnets which are arranged in the recess and commonly generate the magnetic field.

12. The sensor assembly claim 9, wherein the component support comprises a first side and a second side facing away from the first side, wherein the magnetic field sensors of the first and second pair are arranged on the first side, and wherein a third pair of magnetic field sensors is arranged on the second side in order to provide a third sensor signal.

13. The sensor assembly of claim 8, further comprising a temperature correction stage designed to determine a thermally induced position change of the first part relative to the second part from the output signals of the first, second, third, and fourth sensors.

14. A sensor assembly for determining a spatial position of a first part relative to a second part, comprising:
   at least one magnet disposed on the first part and designed for generating a magnetic field that extends to the second part, said magnetic field having a plurality of directions depending on a position relative to the at least one magnet,
   a first, a second, a third and a fourth magnetic field sensor each arranged on the second part and each designed to produce an output signal essentially varying as a function of the direction of the magnetic field at the location of the respective magnetic field sensor,
   a signal generator designed for determining a first and a second sensor signal by combining the output signals from the first, second, third and fourth magnetic field sensors,
   wherein the first and the second magnetic field sensors are arranged at a first spatial distance from one another and form a first pair of magnetic field sensors, said first spatial distance defining a first interval and a first measurement axis transverse to said first interval,
   wherein the third and the fourth magnetic field sensors are arranged at a second spatial distance from one another and form a second pair of magnetic field sensors, said second spatial distance defining a second interval and a second measurement axis transverse to said second interval,
   wherein the at least one magnet is positioned in said first and second intervals,
   wherein the first and second measurement axes are substantially orthogonal with respect to each other,
   wherein the first sensor signal varies as a function of a spatial position of the first part relative to the second part along the first measurement axis and the second sensor signal varies as a function of the spatial position of the first part relative to the second part along the second measurement axis, wherein the second part comprises a component support, on which the first, second, third and fourth magnetic field sensors are commonly arranged, wherein the component support comprises a central recess in which the at least one magnet is arranged, and wherein the at least one magnet comprises a plurality of magnets which are arranged in the recess and commonly generate the magnetic field.

15. The sensor assembly claim 14, wherein the component support comprises a first side and a second side facing away from the first side, wherein the magnetic field sensors of the first and second pair are arranged on the first side, and wherein a third pair of magnetic field sensors is arranged on the second side in order to provide a third sensor signal.

16. The sensor assembly of claim 14, further comprising a temperature correction stage designed to determine a thermally induced position change of the first part relative to the second part from the output signals of the first, second, third, and fourth sensors.

* * * * *